United States Patent [19]

Oosawa

[11] Patent Number: 5,214,654
[45] Date of Patent: May 25, 1993

[54] MEMORY TESTER

[75] Inventor: Toshimi Oosawa, Saitama, Japan

[73] Assignee: Advantest Corporation, Tokyo, Japan

[21] Appl. No.: 637,201

[22] Filed: Jan. 3, 1991

[30] Foreign Application Priority Data

Jan. 12, 1990 [JP] Japan ................. 2-4788

[51] Int. Cl.⁵ .............................. G11C 29/00
[52] U.S. Cl. .................... 371/21.1; 371/27
[58] Field of Search ............ 371/21.1, 27, 21.2; 365/201, 230.01, 189.01

[56] References Cited

U.S. PATENT DOCUMENTS

| | | | |
|---|---|---|---|
| 4,414,665 | 11/1983 | Kimura et al. | 365/201 |
| 4,835,774 | 5/1989 | Ooshima et al. | 371/21.2 |
| 4,888,772 | 12/1989 | Tamigawa | 371/21.2 |
| 4,958,346 | 9/1990 | Fujisaki | 371/27 |
| 4,998,025 | 3/1991 | Watanabe | 371/27 |

FOREIGN PATENT DOCUMENTS

0335125 10/1989 European Pat. Off. .
4011935 10/1990 Fed. Rep. of Germany .

Primary Examiner—Robert W. Beausoliel, Jr.
Assistant Examiner—Trinh Tu
Attorney, Agent, or Firm—Staas & Halsey

[57] ABSTRACT

In a memory tester for testing memories of the type having a polarity inversion feature there are provided a bit select circuit for selecting from an address generated by an address generator a plurality of bits necessary for a logical expression expressing a polarity-inverted data storage area of the memory under test and a bit register circuit for storing bit data which is used to supply the bit select circuit with a select signal for specifying bits to be selectively output. The bits selectively output by the bit select circuit are used as an address for reading out a polarity inversion control signal from an area inversion memory. A polarity inverter, supplied with test data signal from a data generator, outputs the test data intact or after inverting its polarity in accordance with the logic of the polarity inversion control signal, and the output data is written into the memory under test.

4 Claims, 6 Drawing Sheets

SELECT SIG

| x | y | z | 44 | |
|---|---|---|---|---|
| 0 | 0 | 0 | 0 | B1 |
| 1 | 0 | 0 | 1 | B2 |
| 0 | 1 | 0 | 1 | B3 |
| 1 | 1 | 0 | 1 | B4 |
| 0 | 0 | 1 | 0 | B5 |
| 1 | 0 | 1 | 1 | B6 |
| 0 | 1 | 1 | 1 | B7 |
| 1 | 1 | 1 | 1 | B8 |

| $A_0$ | $A_1$ | $A_2$ | $A_3$ | |
|---|---|---|---|---|
| 0 | 0 | 0 | 0 | 0 |
| 1 | 0 | 0 | 0 | 0 |
| 0 | 1 | 0 | 0 | 0 |
| 1 | 1 | 0 | 0 | 0 |
| 0 | 0 | 1 | 0 | 0 |
| 1 | 0 | 1 | 0 | 1 |
| 0 | 1 | 1 | 0 | 0 |
| 1 | 1 | 1 | 0 | 1 |
| 0 | 0 | 0 | 1 | 0 |
| 1 | 0 | 0 | 1 | 0 |
| 0 | 1 | 0 | 1 | 1 |
| 1 | 1 | 0 | 1 | 1 |
| 0 | 0 | 1 | 1 | 0 |
| 1 | 0 | 1 | 1 | 1 |
| 0 | 1 | 1 | 1 | 1 |
| 1 | 1 | 1 | 1 | 1 |

ADDRESS CA

MEMORY TESTER

BACKGROUND OF THE INVENTION

The present invention relates to a semiconductor memory tester and, more particularly, to a memory tester additionally provided with a feature suitable for testing large capacity memories.

Figure 1:
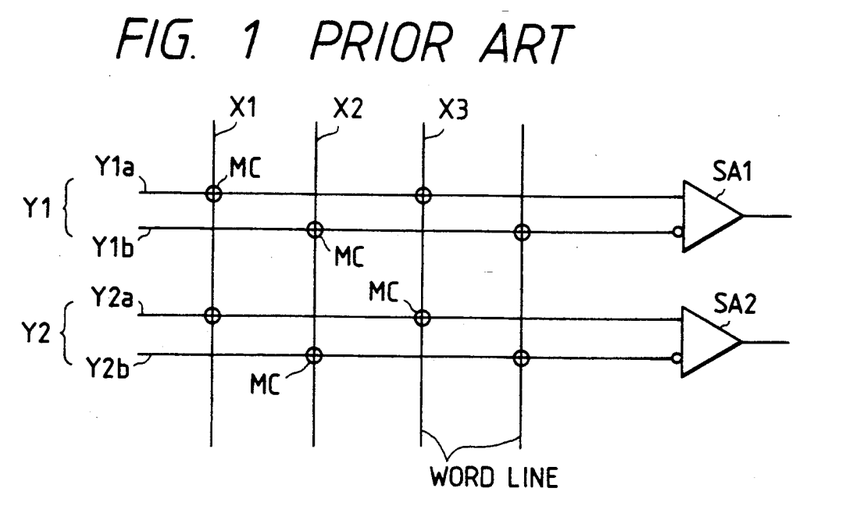
FIG. 1 is a diagram for explaining bit lines of a DRAM equipped with a polarity inversion feature.

A dynamic random access memory (DRAM) employs a differential sense amplifier as a bit sense circuit for readout of memory cells. For example, as shown in FIG. 1, vertical lines A1, X2, ..., called word lines, are provided corresponding to X addresses (column addresses) and paired horizontal lines (Y1a, Y1b), (Y2a, Y2b), ..., called bit lines, are provided corresponding to Y addresses (row addresses). The paired bit lines (Y1a, Y1b), (Y2a, Y2b), ... are each connected to alternate memory cells MC of a sequence of X addresses on the same Y address, and the paired bit lines are each connected at one end to non-inverting and inverting inputs of the corresponding one of sense amplifiers SA1, SA2, ... With such an arrangement, even if a logical value "1" is written into a desired one of the memory cells, the output logic read out therefrom differs, depending on which of the two inputs of the sense amplifier the bit line connected to the desired memory cell MC is connected to. In view of this, the DRAM is adapted so that data stored in the memory cells MC may always be read out in correct logic, by storing the data intact or after inverting its logic, depending on which of the bit lines of each pair the memory cells MC are connected to. Such a function of the DRAM will hereinafter be referred to as an inversion feature. While the above prior art example has been described to employ a structure in which each Y address is accessed via a pair of bit lines, the prior art may sometimes use a structure of accessing each X address via a pair of bit lines and reading it out by a differential sense amplifier, or a combination of such two structures.

As the capacity of the DRAM increases to 4 M bits, 16 M bits, and so on, the coupling capacitance between the bit lines increases and the capacity of each memory cell decreases, reducing the SN ratio of readout. As a solution to this problem, the prior art employs a twisted bit-line system in which bit lines of each pair connected to a differential amplifier alternately cross each other to decrease coupling noise by the neighboring bit lines to thereby improve the SN ratio. Yet, this method involves complicated write control, because addresses to be written after inversion of the logic of data and to be written intact are mixed complicatedly.

A test of a memory equipped with such an inversion feature calls for a traditional test in which a test pattern signal composed of an address and data (composed of test data and expected data) is applied to the memory under test to write therein the test data at a specified address and the data is read out therefrom and checked for coincidence with the expected data, and a test which is made under the condition that data is written in the memory so that a storage area for holding polarity- or logic-inverted data and a storage area for holding non-inverted data may have the same polarity distribution, or the condition that "1's" or "0's" are written in the two storage areas throughout them.

Such a test could be made by modifying or revising a pattern generating program of the pattern generator which generates the test pattern, but the modification of the program is troublesome. Besides, since memories under test are not uniform in specifications and since the polarity-inverted data storage area and the non-inverted data storage area are not fixed, it is also cumbersome to revise the program to meet the specifications.

To avoid this, there has heretofore been proposed a tester which recognizes the polarity-inverted data storage area of the memory under test and permits freely selecting whether or not to "invert" the polarity of the test data signal when accessing the inverted data storage area.

Figure 2:
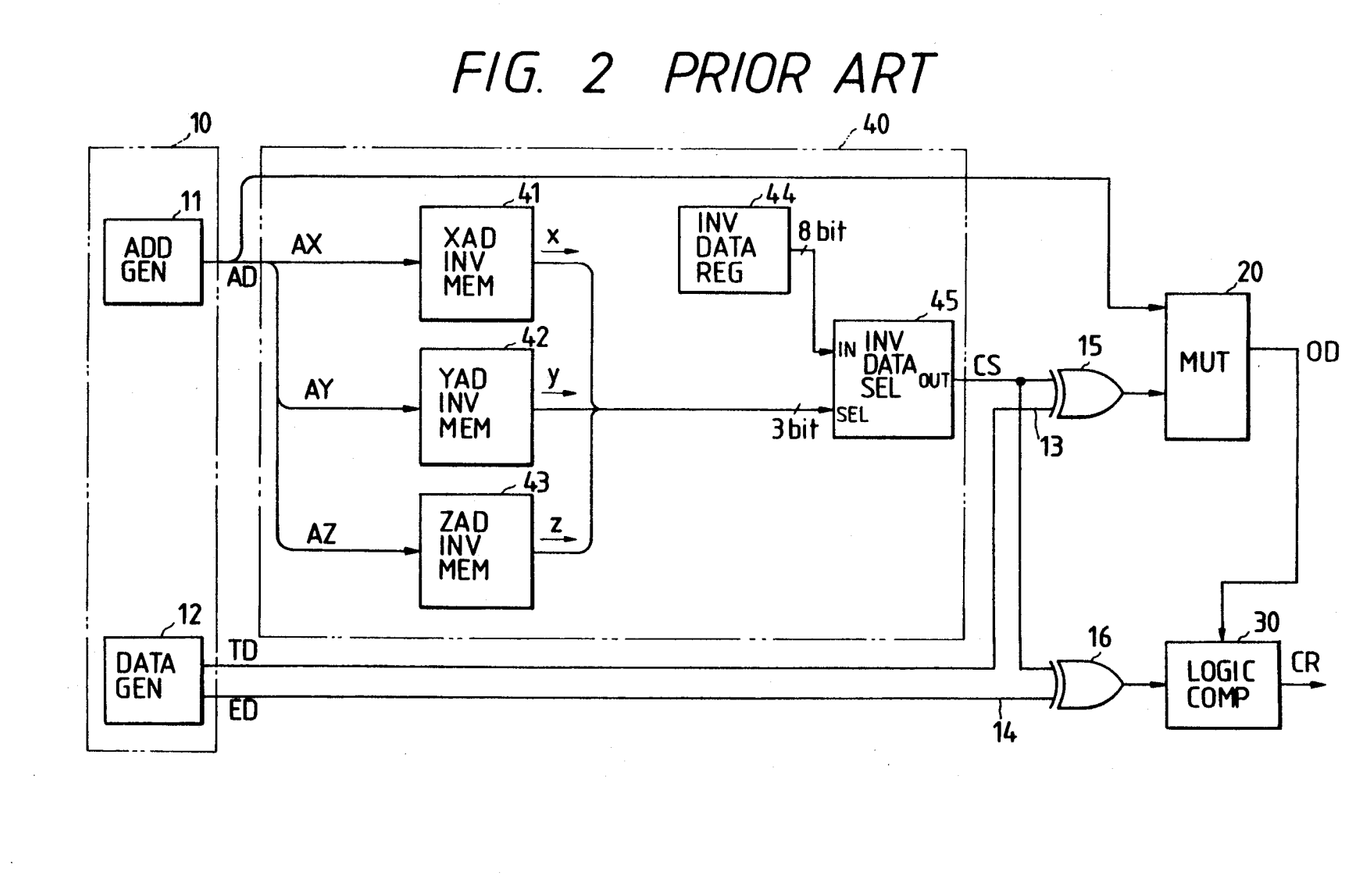
FIG. 2 is a block diagram of a conventional memory tester.

FIG. 2 shows an example of such a conventional tester. Reference numeral 10 indicates a pattern generator, which includes an address generator 11 and a data generator 12 for creating test data and expected value data. An address signal AD available from the address generator 11 is applied to an address input terminal of a memory under test 20 to access it, and at the same time, test data signal TD is applied from the data generator 12 to the memory 20 at the accessed address to effect a write therein or readout therefrom.

A response output OD read out of the memory under test 20 is provided to a logic comparator 30, which compares the output OD with expected value data ED from the data generator 12 and outputs the result of comparison CR. Where the result of comparison CR indicates a mismatch, it is decided that the memory under test 20 is faulty. In some cases, the result of comparison CR is stored in a fail memory (not shown) for a failure analysis of memories.

Polarity switches 15 and 16 are provided in a path 13 of the test data signal TD from the data generator 12 to the memory under test 20 and a path of the expected value data ED from the data generator 12 to the logic comparator 30. The polarity switches 15 and 16 are controlled by a polarity control signal CS available from a polarity controller 40 so that the polarity of the test data signal TD to be written into the memory under test 20 can be selected for each storage area being addressed.

The polarity controller 40 is made up of inverted area memories 41, 42 and 43 provided for recognizing a polarity-inverted data storage area of the memory under test 20, an inversion data register 44 for determining whether or not to invert the polarity of the test data signal TD which is applied to the polarity-inverted data storage area and the expected value data ED, and an inversion data selector 45 which selectively outputs inversion data stored in the inversion data register 44.

In this example, X, Y and Z address signals AX, AY and AZ are employed, which are applied to the three inverted area memories 41, 42 and 43, respectively, to access them individually.

Figure 3:
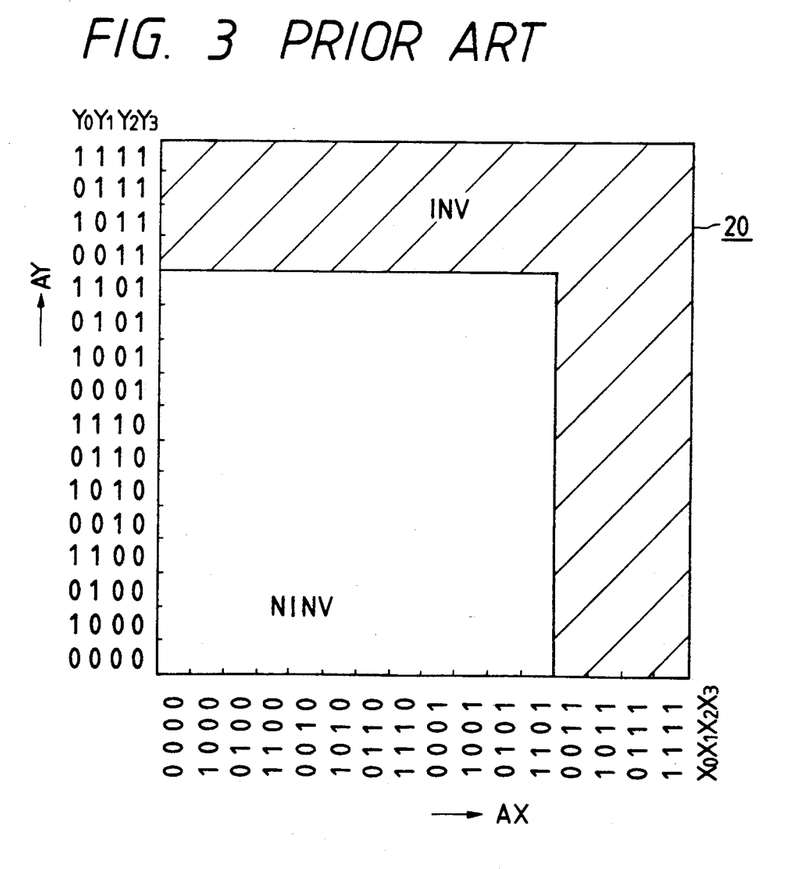
FIG. 3 is a diagram showing an example of a polarity-inverted data storage area.
Figure 4A:
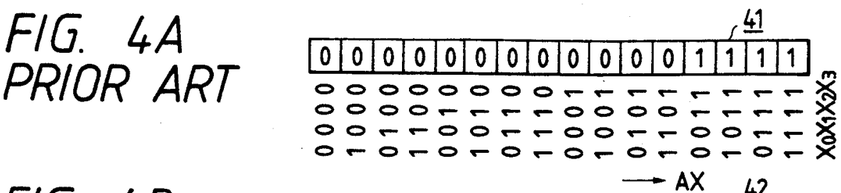
FIG. 4A. is a diagram showing an example of data which is set in an X address area inversion memory.
Figure 4B:
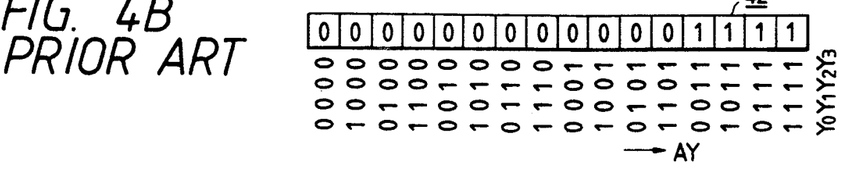
FIG. 4B is a diagram showing an example of data which is set in a Y address area inversion memory.

For example, a "1" logic is prestored in the inverted area memories 41, 42 and 43 at addresses corresponding to the polarity-inverted data storage areas of the memory under test 20. Now, let it be assumed, for the sake of brevity, that the memory under test 20 has a capacity of 256 bits, that its memory cells are each accessed using a 4-bit X address $AX = X_0 X_1 X_2 X_3$, a 4-bit Y address $AY = Y_0 Y_1 Y_2 Y_3$ and that no Z address is used. Consider that the entire area of the memory 20 is divided into a hatched polarity-inverted data storage area INV and a blank non-polarity inverted data storage area NINV as shown in FIG. 3. In this instance, as will be seen from FIG. 3, the X address AX in the polarity-inverted data storage area is expressed by $AX = **11$, where * is a "0" or "1", and the Y address AY is expressed by $AY = **11$. Hence, in the X address inverted area memory 41 there are prestored "1's" at addresses "0011" to "1111" as depicted in FIG. 4A, whereas in the Y address inverted area memory 42 there are prestored "1's" at addresses "0011" to "1111" as depicted in FIG. 4B. Consequently, when an address in the polarity-inverted data storage area of the memory under test 20 is read out of the address generator 11, the "1" logic is read out of each of the inverted area memories 41, 42 and 43.

Pieces of data x, y and z read out of the inverted area memories 41, 42 and 43 are input, as a 3-bit select signal, into the inversion data selector 45. The inversion data selector 45 responds to the 3-bit select signal xyz to select and output inversion data prestored in the inversion data register 44 for determining whether or not to invert the test data signal.

Figure 5:
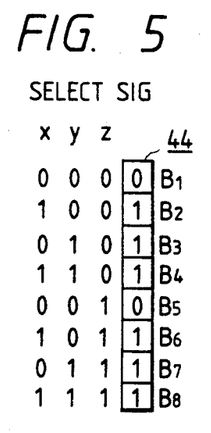
FIG. 5 is a diagram showing an example of data which is set in an inversion data register circuit.

The inversion data register 44 can be formed by, for example, an 8-bit register. When the select signal xyz composed of the data read out of the three inverted area memories 41, 42 and 43 is any one of "000" to "111", the inversion data selector 45 outputs corresponding one of first to eighth bits $B_1$ to $B_8$ of the inversion data register 44 as shown in FIG. 5. In the case where the memory under test 20 has the polarity-inverted data storage area INV as depicted in FIG. 3, if at least one of the pieces of data or bits x and y read out by the X and Y addresses AX and AY from the X and Y address inverted area memories 41 and 42 shown in FIG. 4A and 4B is a "1", then the memory cell specified by the X and Y addresses AX and AY is within the polarity-inverted data storage area INV; therefore, "1's" are prestored at all of those bit positions in the inversion data register 44 which are selected by the select signal xyz in which at least one of its bits x and y goes to a "1". Thus, there are stored, for example, "0, 1, 1, 1, 0, 1, 1, 1" in the 8-bit register 44 as shown in FIG. 5. That is, when the select signal xyz is either "000" or "001", inversion data "0" of either the first or fifth bits $B_1$ or $B_5$ is selected and provided to the polarity switches 15 and 16. When the select signal xyz is any one of "100", "010", "110", "101", "011" and "111", the inversion data selector 45 selects inversion data "1" at a corresponding one of the second, third, fourth, sixth, seventh and eighth bits $B_2$, $B_3$, $B_4$, $B_6$, $B_7$ and $B_8$, and provides the inversion data of the logic "1" to the polarity switches 15 and 16.

The polarity switches 15 and 16 in this example are shown to be formed by exclusive-OR circuits. When they are supplied with the inversion data of the logic "0" from the inversion data selector 45, the test data signal TD and the expected value data ED from the data generator 12 are applied intact to the memory under test 20 and the logic comparator 30 without being inverted in polarity (i.e. logic). On the other hand, when supplied with the inversion data of the logic "1", the polarity switches 15 and 16 invert the polarities of the test data signal TD and the expected value data ED from the data generator 12 which are applied to the memory under test 20 and the logic comparator 30. Consequently, in the above example the test data signal TD to be written into the polarity-inverted data storage area INV in FIG. 3 is inverted in logic. As will be appreciated from the above, the polarity-inverted data storage area INV of the memory under test 20 can be altered by modifying data to be prestored in the X and Y address inverted region memories 41 and 42 shown in FIGS. 4A and 4B and/or data to be prestored in the inversion data register 44 shown in FIG. 5. In the FIG. 3 example of the polarity-inverted data storage area INV, the polarity inversion takes place in areas where high-order two bits $X_2$ and $X_3$ of the X address $AX = X_0X_1X_2X_3$ are both "1's" and areas where high-order two bits $Y_2$ and $Y_3$ of the Y address $AY = Y_0Y_1Y_2Y_3$ are both "1"; hence, the polarity-inverted data storage area INV is specified by addresses AX, AY, AZ which satisfy the following logical expression:

$$1 = X_2 \cdot X_3 + Y_2 \cdot Y_3 \tag{1}$$

Figure 6:
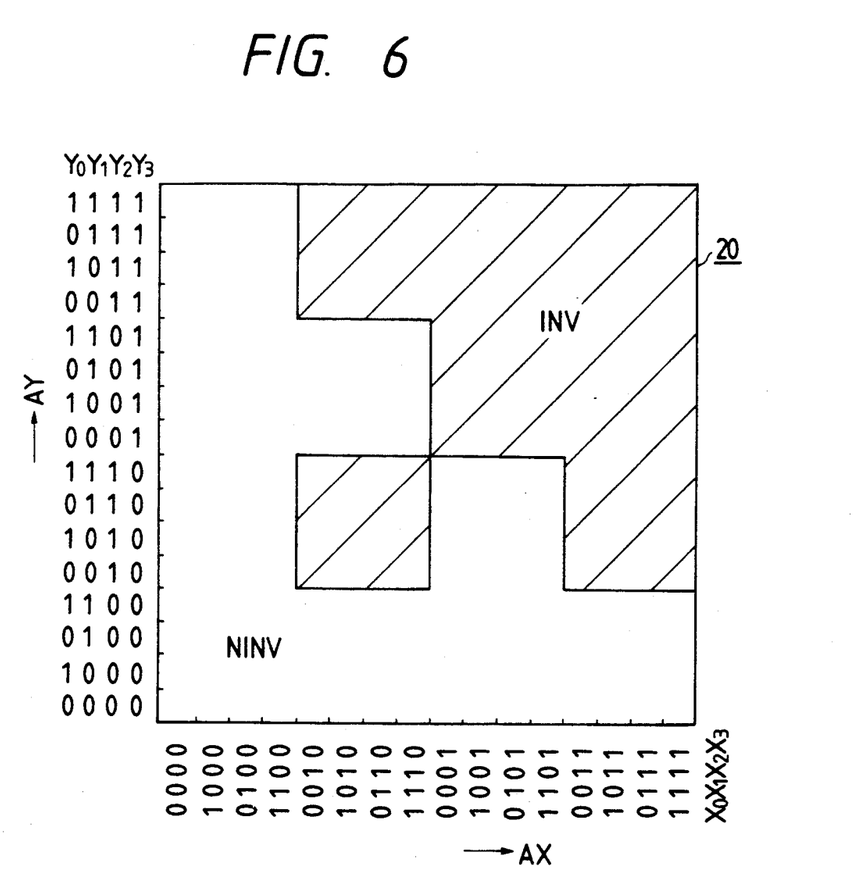
FIG. 6 is a diagram showing another example of the polarity-inverted data storage area.

In the conventional semiconductor memory tester shown in FIG. 2, however, as represented by the example of the logical expression (1), the polarity-inverted data storage areas that can be specified are limited to only simple ones, because the basic principle of specifying the polarity-inverted data storage area is based on the specifying of the X address polarity inverted area, the Y address polarity inverted area and the Z address polarity inverted area by the A address AX, the Y address AY and Z address AX ($X_2 \cdot X_3$ and $Y_2 \cdot Y_3$ in the logical expression (1), for example) and on the selection of a combination of the specified areas (a logical sum or logical product, for instance, the logical sum of $X_2 \cdot X_3$ and $Y_2 \cdot Y_3$ in the above-mentioned logical expression). For example, the hatched polarity-inverted data storage area in FIG. 6 can be specified by addresses which satisfy the following logical expression (2) in which $X_3$ and $Y_2$ in the logical expression (1) are exchanged with each other:

$$1 = X_2 \cdot Y_2 + X_3 \cdot Y_3 \tag{2}$$

With the device shown in FIG. 2, however, it is impossible to specify such a polarity-inverted data storage area as expressed by the logical expression (2). That is to say, a polarity-inverted data storage area, which is expressed by a logical expression including at least two of the logical AND between the X and Y addresses AX and AY, the logical AND between the X and Z addresses AX and AZ and the logical AND between the Y and Z addresses AY and AZ, cannot be specified except in special cases.

The prior art device calls for large-capacity memories as the inverted area memories 41, 42 and 43, because they need to have a bit capacity corresponding to the number of all addresses used which is determined by the address length of the X, Y and Z address signals AX, AY and AZ. For example, when the address signals AX, AY and AZ are 16-bit, 64 K-bit memories are needed for the X, Y and Z inverted area memories 41, 42 and 43. No Z address may sometimes be needed and when used, it may be appreciably shorter than the X and Y addresses in many cases.

SUMMARY OF THE INVENTION

It is therefore an object of the present invention to provide a memory tester which is used to test memories having built therein the polarity inversion feature and which enables an area of an arbitrary shape to be specified with a small amount of hardware.

According to the present invention, in a memory tester which is provided with an address generator for generating an address signal to be applied to a memory under test, a data generator for generating a test data signal to be applied to the memory under test in synchronism with the address signal from the address general or and an expected value data, a polarity inverter whereby the polarity of the test data signal to be applied to the memory under test from the data generator is inverted in accordance with the polarity-inverted data storage area in the memory under test, and a polarity controller which supplies the polarity inverter with a control signal for the inversion, there are included: a bit register circuit for storing those of bits in the address signal from the address generator to the polarity controller which are used to select an area to be polarity inverted; a bit select circuit whereby predetermined bits in the address signal from the address generator are selected using the bit data set in the bit register circuit; and an area inversion memory which is accessed by a composite address signal composed of the bits selected by the bit select circuit, detects the application of the address signal in the area to be polarity inverted to the memory under test and applied a polarity inversion signal to the polarity inverter.

With the above-mentioned construction of the present invention, the bit positions in the address signal which define the area to be polarity inverted in accordance with the type of the memory under test are set in the bit register circuit. The bit data thus set in the bit register circuit is provided to the bit select circuit, by which a predetermined number of bits set in the bit register circuit are extracted and provided as a composite address signal to the area inversion memory. In the area inversion memory the polarity inversion signal is written at addresses corresponding to that area of the memory under test in which data is written after being polarity inverted.

Thus, according to the present invention, when that area in the memory under test which is polarity inverted is accessed, the polarity inversion signal is read out of the area inversion memory. The polarity inversion signal is applied to the polarity inverter, by which the polarity of the data signal to be applied from the data generator to the memory under test.

According to the present invention, the area inversion memory need not be large-capacity, because it is accessed using the composite address signal composed of a minimum number of bits necessary for defining the polarity-inverted data storage area of the memory under test as described above. In addition, by prestoring the polarity inversion signal at a desired address in the area inversion memory, the polarity inversion signal can be generated for any address area. Moreover, nonuse of such a large-capacity memory as in the prior art affords reduction of the amount of hardware used -- this cuts the manufacturing cost of the memory tester and permits its high-speed operation.

DESCRIPTION OF THE PREFERRED EMBODIMENT

Figure 7:
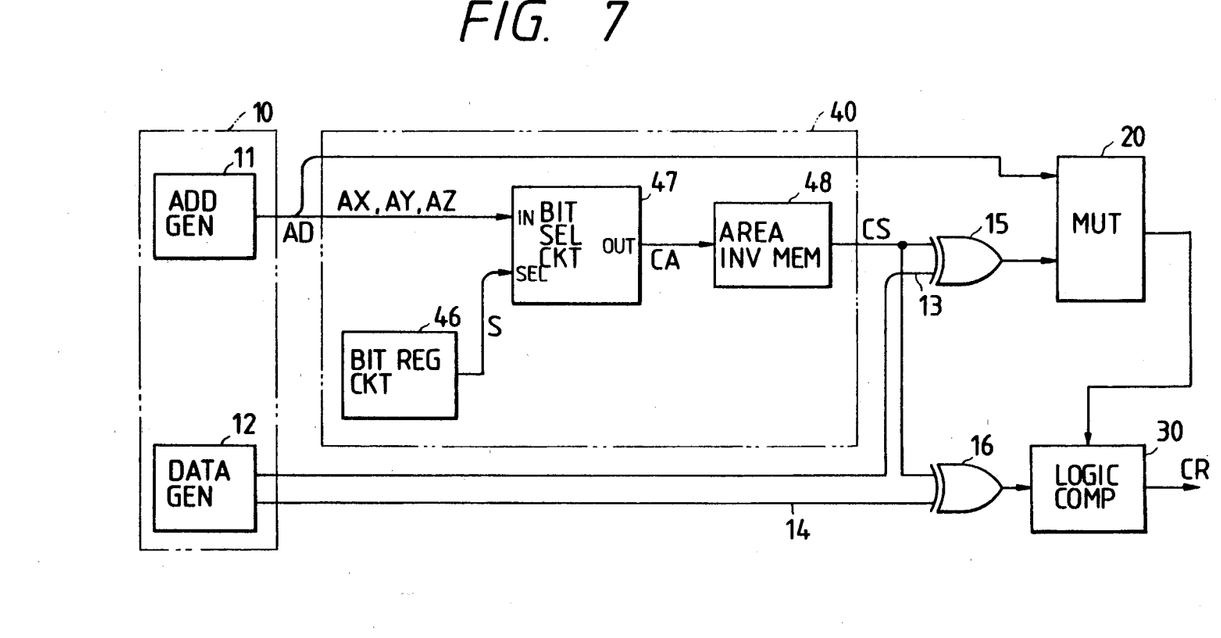
FIG. 7 is a block diagram illustrating an embodiment of the memory tester of the present invention.

FIG. 7 illustrates in block form an embodiment of the present invention, in which the parts corresponding to those in FIG. 2 are identified by the same reference numerals.

According to the present invention, in the memory tester which is provided with the pattern generator 10, the polarity controller 40, the polarity inverters 15 and 16 and the logic comparator 30, for testing memories having the polarity inversion feature, the polarity controller 40 is formed by a bit register circuit 46, a bit select circuit 47 and an area inversion memory 48.

All bits of the address signal AD (composed of the X, Y and Z addresses AX, AY and AZ) from the address generator 11 are provided in parallel to the bit select circuit 47, from which a desired number of bits at desired bit positions are selected from all the bits and output in response to select signals S applied from the bit register circuit 46. In the bit register circuit 46 there are prestored bit data for outputting a required number of select signals S for specifying the bit positions to be selected in the bit select circuit 47. A composite address CA composed of the bits selected by the bit select circuit 47 is provided to the area inversion memory 48 to read out therefrom the polarity inversion control signal CS, which is applied to the polarity inverters 15 and 16.

Figure 8:
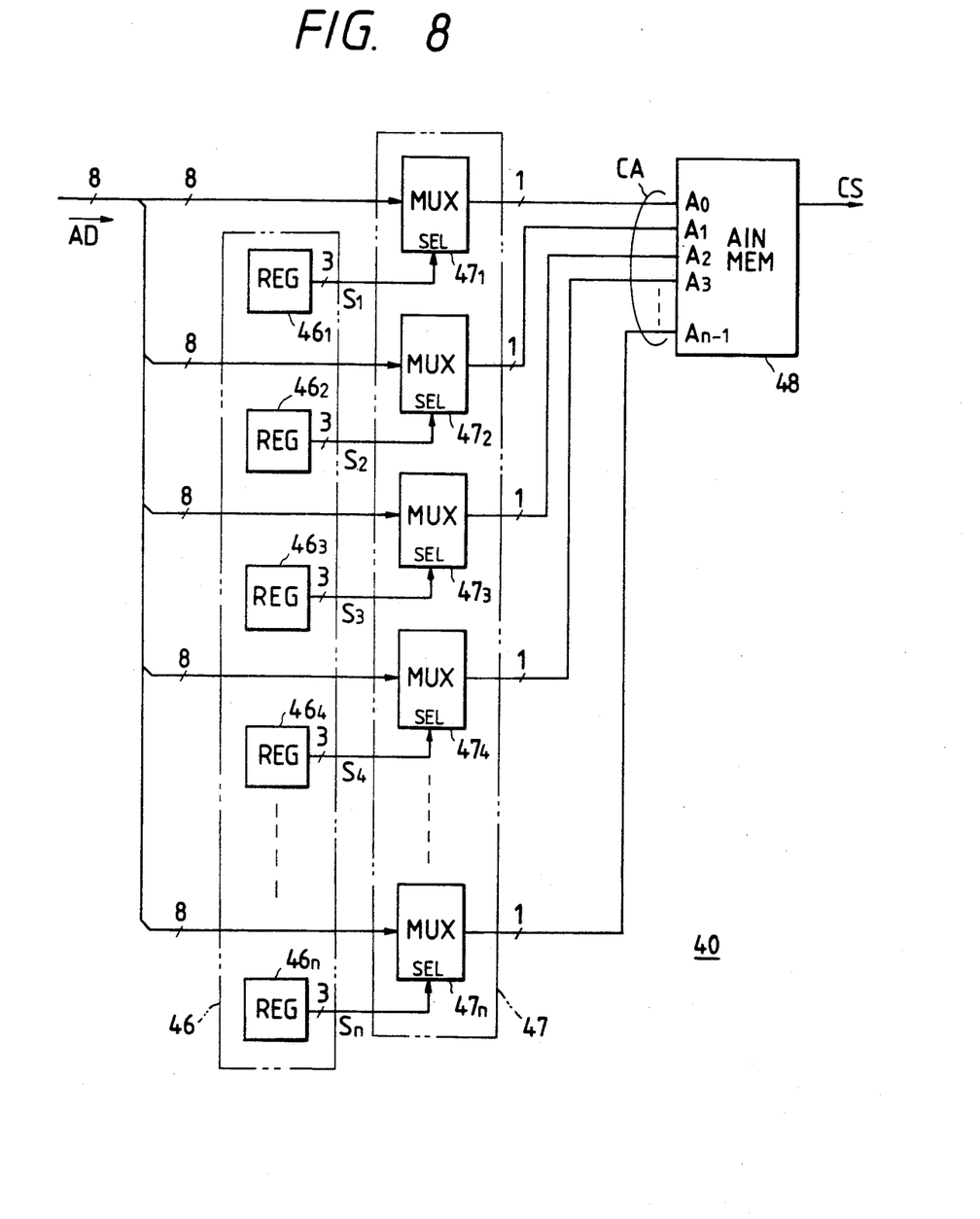
FIG. 8 is a diagram showing an operative specific example of a polarity controller 40 in FIG. 7.

FIG. 8 illustrates a specific operative example of the polarity controller 40 in FIG. 7. The bit select circuit 47 is made up of a predetermined number n (where n is an integer equal to or greater than 2) of multiplexers $47_1$ to $47_n$, each of which is supplied with all the bits of the address signal AD in parallel. The bit register circuit 46 includes n registers $46_1$ to $46_n$, each having stored therein bit select data. The bit select data in the registers $46_1$ to $46_n$ is provided as select signals $S_1$ to $S_n$ to select control terminals SEL of the corresponding multiplexers $47_1$ to $47_n$, by which each multiplexer outputs a desired bit specified by all the bits of the input address AD. The n pieces of bit data selectively output from the multiplexers $47_1$ to $47_n$ are combined into the composite address CA, which is applied to the area inversion memory 48, from which inversion control data is read out as the polarity inversion control signal CS.

Next, the operation of the memory tester of the present invention, shown in FIG. 7, will be described with reference to a simple example as is the case with the prior art example depicted in FIG. 2. Let it be assumed that the memory under test 20 is a 256-bit memory having such a polarity-inverted data storage area INV as shown in FIG. 6. Further, assume that the address AD for accessing the memory 20 is composed of the 4-bit X address $AX=X_0X_1X_2X_3$ and the 4-bit Y address $AY=Y_0Y_1Y_2Y_3$, and consequently the Z address is not used.

The polarity-inverted data storage area INV depicted in FIG. 6 can be specified by every address which satisfies the afore-mentioned logical expression (2). Therefore the bits necessary for specifying the polarity-inverted data storage area INV are only $X_2$, $X_3$, $Y_2$ and $Y_3$, and these bits are selectively output by the bit select circuit 47.

Consequently, the numbers of multiplexers $47_1$ to $47_n$ and registers $46_1$ to $46_n$ in FIG. 8 are both at least four, and suppose that the multiplexer and the register corresponding to n in FIG. 8 are not present. The multiplexers $47_1$ to $47_4$ are supplied with the 8-bit address signal AD and each select one of the eight bits; hence the select signals $S_1$ to $S_4$ are each composed of three bits. Thus, the registers $46_1$ to $46_n$ are 3-bit registers. The multiplexers $47_1$ to $47_4$ respond to the select signals $S_1$ to $S_4$ to selectively output the bits $X_2$, $X_3$, $Y_2$ and $Y_3$, respectively, which are provided as the composite address CA to the area inversion memory 48.

Figure 9:
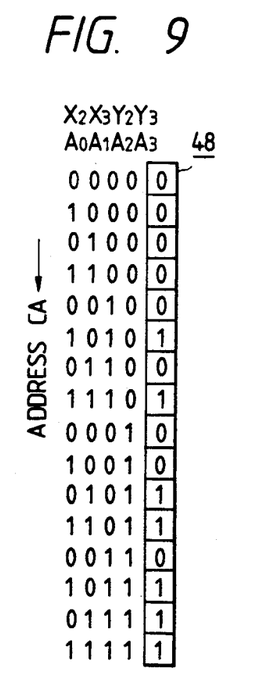
FIG. 9 is a diagram showing an example of data which is stored in an area inversion memory 48.

In the area inversion memory 48 there are written "1's" at all addresses which satisfy the logical expression (2), as shown in FIG. 9. Consequently, in the case where the bits $X_2$, $X_3$, $Y_2$ and $Y_3$ in the 8-bit address signal $AD=X_0X_1X_2X_3Y_0Y_1Y_2Y_3$ generated from the address generator 11 satisfy the logical expression (2), a "1" is read out of the area inversion memory 48 and is provided to the polarity inverters 15 and 16, from which the test data signal TD and the expected value data ED of the inverted logic are output, respectively. In consequence, in the polarity-inverted data storage area INV of the memory under test 20 data is written in the same logic as in the other areas and the logic of the expected value data ED which is applied to the logic comparator 30 is also inverted.

The above example has been described in connection with the memory 20 having such a polarity-inverted data storage area INV as depicted in FIG. 6, but in the case of the polarity-inverted data storage area INV of the memory shown in FIG. 3, the same bits $X_2$, $X_3$, $Y_2$ and $Y_3$ as those mentioned above are selectively output by the multiplexers $47_1$ to $47_4$ and in the area inversion memory 48 "1's" are prestored in all bits of the composite addresses $CA=X_2X_3Y_2Y_3$ which satisfy the logical expression (1). The data which is written into the area inversion memory 48 at addresses 0000 to 1111 is "0, 0, 0, 1, 0, 0, 0, 1, 0, 0, 0, 1, 1, 1, 1, 1".

In the above the polarity controller 40 has been described on the assumption n=4 for the sake of brevity, but it is considered that even if the polarity-inverted data storage area of, for example, a 16 M-bit or 32 M-bit DRAM which is tested by the actual memory tester is complicated in shape, 10 to 12 bits would be sufficient for the logical expression Which expresses the complicated area; hence, the actual value n is selected in the range of 10 to 12. Even if n is set to 12, the capacity necessary for the area inversion memory 48 is only 4 K bits, and this is far smaller than the total capacity needed for the X, Y and Z area inversion memories in FIG. 2.

As described above, the present invention enables a polarity-inverted data storage area of a complicated shape to be specified, since the polarity controller 40 is made up of the bit register circuit 46, the bit select circuit 47 and the area inversion memory 48 and since the bits necessary for the logical expression which expresses the polarity-inverted data storage area can freely be selected from the input address by the bit select circuit. Furthermore, the present invention affords substantial reduction of manufacturing costs of the memory tester, because the area inversion memories 41, 42 and 43 (see FIG. 2) need not be provided for the address signals AX, AY and AZ. Besides, the large-capacity area inversion memories 41, 42 and 43 used in the prior art need not be used and the area inversion memory 48 employed in the present invention may be a small-capacity memory, so that the operating speed of the memory tester of the present invention can be increased.

It will be apparent that many modifications and variations may be effected without departing from the scope of the novel concepts of the present invention.

What is claimed is:

1. A memory tester for testing memories equipped with a polarity inversion feature, comprising:
   a memory under test;
   an address generating section, operatively connected to said memory under test, for generating an address signal to be applied to said memory under test;
   a data generating section, operatively connected to said memory under test, for generating a test data signal to be applied to said memory under test in synchronism with said address signal from said address generating section and for generating an expected value data;
   a polarity inverter, operatively connected to said data generating section, responsive to a polarity inversion signal to invert the polarity of said test data signal to be applied from said data generating section to said memory under test; and
   a polarity controller, operatively connected to said polarity inverter, for applying said polarity inversion signal to said polarity inverter, said polarity controller including:
      a bit register circuit which stores bit data for specifying in said address signal a plurality of bits necessary for a logical expression which expresses a polarity-inverted data storage area and outputs a bit data set;
      a bit select circuit for selectively outputting those bits in said address signal specified by said bit data set in said bit register circuit; and
      an area inversion memory which is accessed by a composite address signal composed of said plurality of bits selectively output by said bit select circuit to read out said polarity inversion signal, said polarity inversion signal being applied to said polarity inverter.

2. The memory tester of claim 1, wherein said bit select circuit includes a predetermined number of multiplexers each of which is supplied with said address signal and selectively outputs a specified one bit in said address signal.

3. The memory tester of claim 1, wherein said area inversion memory has stored therein one logic of said polarity inversion signal at every address which satisfies said logical expression.

4. The memory tester of claim 1, further comprising:
   another polarity inverter which is supplied with said expected value data signal and outputs said expected value data signal intact or after converting its logic in accordance with a logic of said polarity inversion signal; and
   a logic comparator for making a logical comparison between the output of said another polarity inverter and data read out of said memory under test and outputting a result of said logical comparison.

* * * * *